(12) United States Patent
Kamimoto et al.

(10) Patent No.: US 6,445,345 B1
(45) Date of Patent: Sep. 3, 2002

(54) MICROSTRIP LINE AND MICROWAVE DEVICE USING THE SAME

(75) Inventors: Ryuichi Kamimoto, Aichi; Hirokazu Kitamura, Gifu; Kazuyuki Kirimura, Gifu; Yasuhiro Hibino, Gifu, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/666,200

(22) Filed: Sep. 21, 2000

(30) Foreign Application Priority Data

Feb. 15, 2000 (JP) ......................................... 2000-036134

(51) Int. Cl.$^7$ ................................................ H01Q 1/36
(52) U.S. Cl. ................. 343/700 MS; 343/772; 343/878; 333/26
(58) Field of Search ................ 343/700 MS, 762, 343/772, 878, 884; 333/26

(56) References Cited

U.S. PATENT DOCUMENTS

| | | | |
|---|---|---|---|
| 4,521,755 A | 6/1985 | Carlson et al. | 333/244 |
| 4,827,276 A | 5/1989 | Fukuzawa et al. | 333/778 |
| 5,127,102 A * | 6/1992 | Russell | 455/327 |
| 5,304,959 A * | 4/1994 | Wisherd et al. | 333/26 |
| 5,406,235 A | 4/1995 | Hayashi | 333/204 |
| 5,652,557 A * | 7/1997 | Ishikawa | 333/243 |
| 5,781,161 A * | 7/1998 | Kinoshita et al. | 343/750 |
| 5,801,599 A * | 9/1998 | Flynn et al. | 333/26 |

FOREIGN PATENT DOCUMENTS

| | | |
|---|---|---|
| GB | 1247235 | 9/1971 |
| JP | 63-262905 | 10/1963 |
| JP | 53-21549 | 2/1978 |
| JP | 54-84453 | 7/1979 |
| JP | 62-269401 | 11/1987 |
| JP | 5-22005 | 1/1993 |
| JP | 09298407 | 11/1997 |

* cited by examiner

Primary Examiner—Don Wong
Assistant Examiner—Shih-Chao Chen
(74) Attorney, Agent, or Firm—RatnerPrestia

(57) ABSTRACT

The present invention provides a low cost microstrip line with low loss and a microwave device using the microstrip line. The microstrip line comprises (a) a dielectric substrate for general purpose use with relatively high loss in a microwave frequency, (b) a strip conductor foil disposed on the front surface of the substrate, (c) a metal plate for grounding disposed in contact with the back of the dielectric substrate, and (d) an air layer formed on a portion of the metal plate for grounding, the portion facing to the strip conductor foil.

16 Claims, 8 Drawing Sheets

MICROSTRIP LINE AND MICROWAVE DEVICE USING THE SAME

FIELD OF THE INVENTION

The present invention relates to a microstrip line which is used in consumer microwave receivers for receiving signals of satellite broadcasting, satellite communications and the like, and to a microwave device using the microstrip line.

BACKGROUND OF THE INVENTION

In consumer microwave receivers (for satellite broadcasting, satellite communications and so on) which use the 12 GHz band, microwave signals received from a receiving antenna are very weak. Such signals are so weak that they are sent directly to a low noise amplifier through a microwave transmission line in order to be minimally attenuated (by circuit loss, for example), and to be minimally imposed by noise. The microwave transmission line and the low noise amplifier are located in a block down-converter which is usually coupled to the receiving antenna. The microwave transmission line has usually been a microstrip line which is constructed by a printed circuit board (hereinafter PCB) using a low loss dielectric substrate.

FIG. 5 shows an example of a conventional microstrip line which is constructed by a PCB made of the low loss dielectric substrate. As shown in FIG. 5, the microstrip line is formed in PCB 2 in such a manner that conductive foil 1 for grounding and conductive foil 3 for strip conductor are disposed on the back surface and the front surface of PCB 2, respectively.

The thickness of PCB 2 for the 12 GHz band is 1 mm or less, so that PCB 2 may be deformed by mechanical and thermal distortions. PCB 2 is held in contact with the face of metal plate 4 for grounding. Plate 4 protects the microstrip line from property degradation caused by the distortions.

It is theoretically known that width 5 of strip conductor foil 3 is mainly determined by operating frequency, desired characteristic impedance, relative dielectric constant of the dielectric substrate, and thickness of conductor foil 3.

For the purpose of the use mentioned above, transmission loss in the microstrip line is preferred to be reduced to a minimum. It is known also that the transmission loss includes dielectric loss of the PCB, copper loss of the strip conductor, and radiation loss from the strip conductor. In particular, the dielectric loss of the PCB and the radiation loss from the strip conductor become remarkable in the microwave frequency band.

Though a teflon-fiber substrate with low dielectric loss has been widely used for conventional PCB 2, the teflon-fiber substrate is relatively so expensive that a microwave device using a teflon-fiber substrate has been also expensive.

On the other hand, glass-epoxy substrate for a low cost PCB in common use in a lower frequency than the microwave has not only high dielectric dissipation factor (tan δ) but also large relative dielectric constant of about 4 larger than that of 2 of the teflon-fiber. Therefore, when a microstrip line is made of a glass-epoxy substrate with the. same thickness and the same characteristic impedance as it is made of a teflon-fiber substrate, the width of the strip line made of the glass-epoxy substrate is smaller than the width of the microstrip line made of the teflon-fiber substrate. Consequently, the loss in the microstrip line disposed on the PCB of glass-epoxy is increased by copper loss of the strip conductor in addition to the dielectric loss of the PCB.

SUMMARY OF THE INVENTION

A microstrip line comprises a PCB, a strip conductor foil which is disposed on the front of the PCB for microwave transmission (hereinafter referred to as strip conductor), and a metal plate for grounding which is disposed in contact with the back of the PCB (hereinafter referred to as ground plate). The ground plate has a groove running along the strip conductor facing towards the strip conductor, and the groove acts as an air layer formed between the PCB and the ground plate. The microstrip line having a structure mentioned above is regarded as a microstrip line having a combined dielectric layer into which the PCB and the air layer are combined. The effective complex relative dielectric constant is determined according to a ratio of thickness of the PCB and thickness of the air layer, and can be set to a desired intermediate value between the two complex relative dielectric constants of the PCB and the air layer. Since it can be safely said that the complex relative dielectric constant of the air layer is practically the same as that of the vacuum, i.e. "1+j0". In other words, both the real part and the imaginary part of the effective complex relative dielectric constant become smaller than those of the PCB itself. Thus the decrease in the real part of the effective complex relative dielectric constant allows the width of the strip conductor to be increased and allows copper loss to be decreased. Furthermore, the decrease in the imaginary part of the effective complex relative dielectric constant allows the effective dielectric loss of the combined dielectric layer to be decreased.

A microwave transmission line between an input terminal and an impedance matching circuit and the impedance matching circuit are constructed by a microstrip line which has a strip conductor, a dielectric substrate, an air layer, and a ground plate, so as to amplify input microwave signal and keep noise figure at a low level.

Furthermore, using a waveguide probe for a port of input terminal taking microwave signal out of a waveguide enables to make a small-sized, low-loss, and high-performance microwave device.

DESCRIPTION OF THE PREFERRED EMBODIMENT

The preferred embodiments of the present invention are described hereinafter with reference to the accompanying drawings.

First Embodiment

Figure 1:
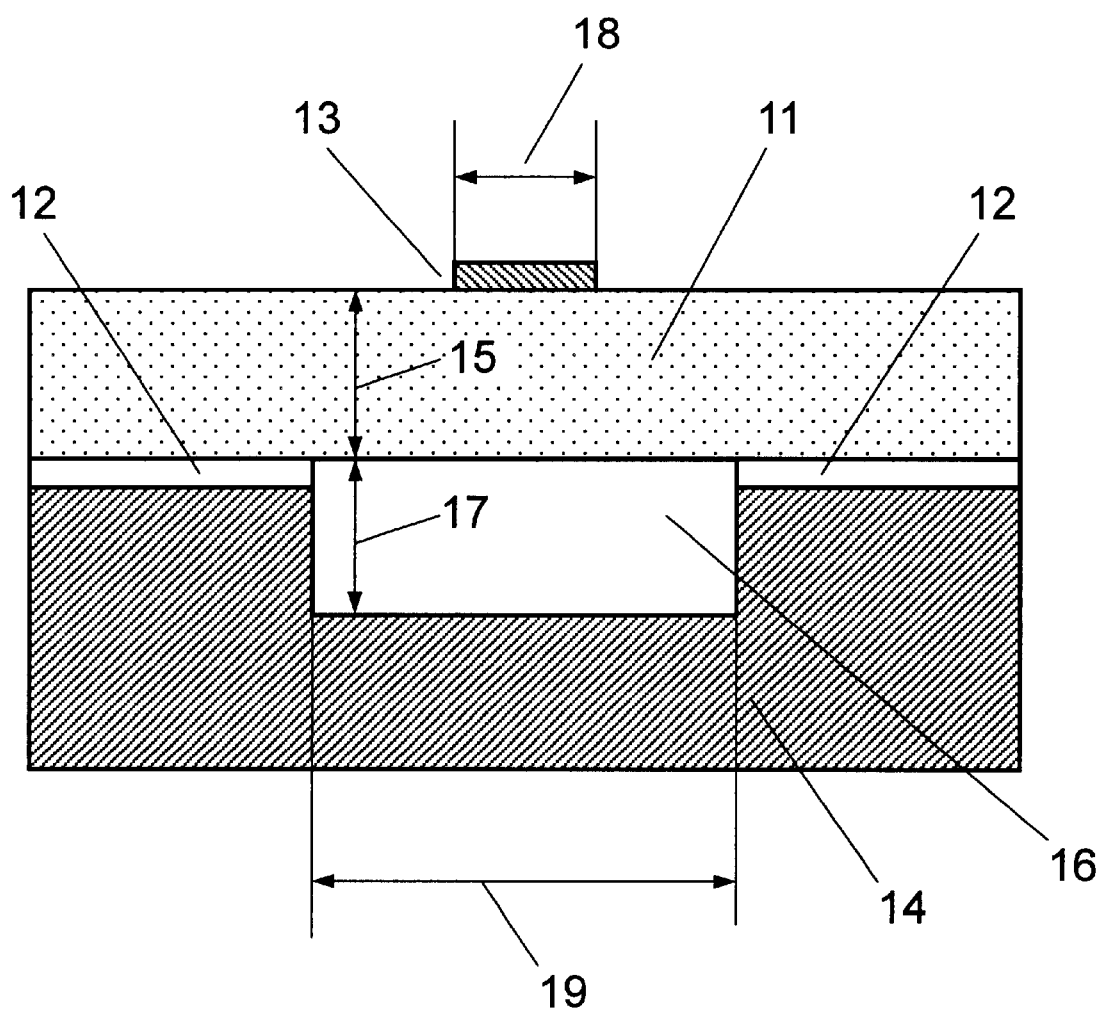
FIG. 1 is a cross-sectional view of a microstrip line in accordance with a first exemplary embodiment of the present invention.

FIG. 1 is a cross-sectional view of a microstrip line in accordance with a first embodiment of the present invention. Strip conductor 13 and conductive foil 12 for grounding are disposed on the front and the back of PCB 11 made of glass-epoxy respectively. Ground plate 14 is located in contact with conductive foil 12 to hold PCB 11 mechanically and to ground conductive foil 12 electrically. Relative dielectric constant of PCB 11 is about 4, and the thickness about 0.5 mm.

As shown in FIG. 1, ground plate 14 has a groove running along strip conductor 13 (in the direction perpendicular to the plane of the page, i.e. in the direction of the microwave propagation) on the side of ground plate 14, facing to strip conductor 13, to form air layer 16 having a depth of about 0.3 mm. We recognize experimentally that a combined dielectric layer, into which PCB 11 (relative dielectric constant about 4) and air layer 16 (relative dielectric constant about 1) are combined, has a effective relative dielectric constant of about 2 at 12 GHz with the PCB having thickness of about 0.5 mm and the air layer having a depth of about 0.3 mm.

To make a characteristic impedance (e.g. 50 ohms) without the air layer, the width of strip conductor 18 is set to 0.94 mm, however the width of 0.94 mm is so narrow that the copper loss of the strip conductor is not negligible as mentioned above. In comparison to this, to make the same characteristic impedance (i.e. 50 ohms) with the air layer, the width of strip conductor 18 can be set to about 2.6 mm experimentally, therefore it is recognized that the copper loss of the strip conductor is reduced. Furthermore, since the effective dielectric loss of the microstrip line is reduced by the air layer, the total loss of the microstrip line with the air layer using glass-epoxy PCB becomes as low as a microstrip line without an air layer using a teflon-fiber PCB finally. In this case, the width 19 of the air layer is three times the width 18 of the strip conductor so as to obtain both necessary and sufficient effect of the air layer.

The construction mentioned above allows a low cost microstrip line to have sufficient characteristics because of reduced transmission loss.

Furthermore in this embodiment, the microstrip line differs from a usual microstrip line only in the structure of ground plate. When various kinds of microstrip-line-based microwave circuits are located on the PCB, some microstrip lines, which transmission loss is not so important item for design, do not need to form an air layer and allow width 18 of their own strip conductor to be reduced. As a result, there is an advantage that the circuit using the microstrip lines can be downsized as a whole

Second Embodiment

Figure 2A:
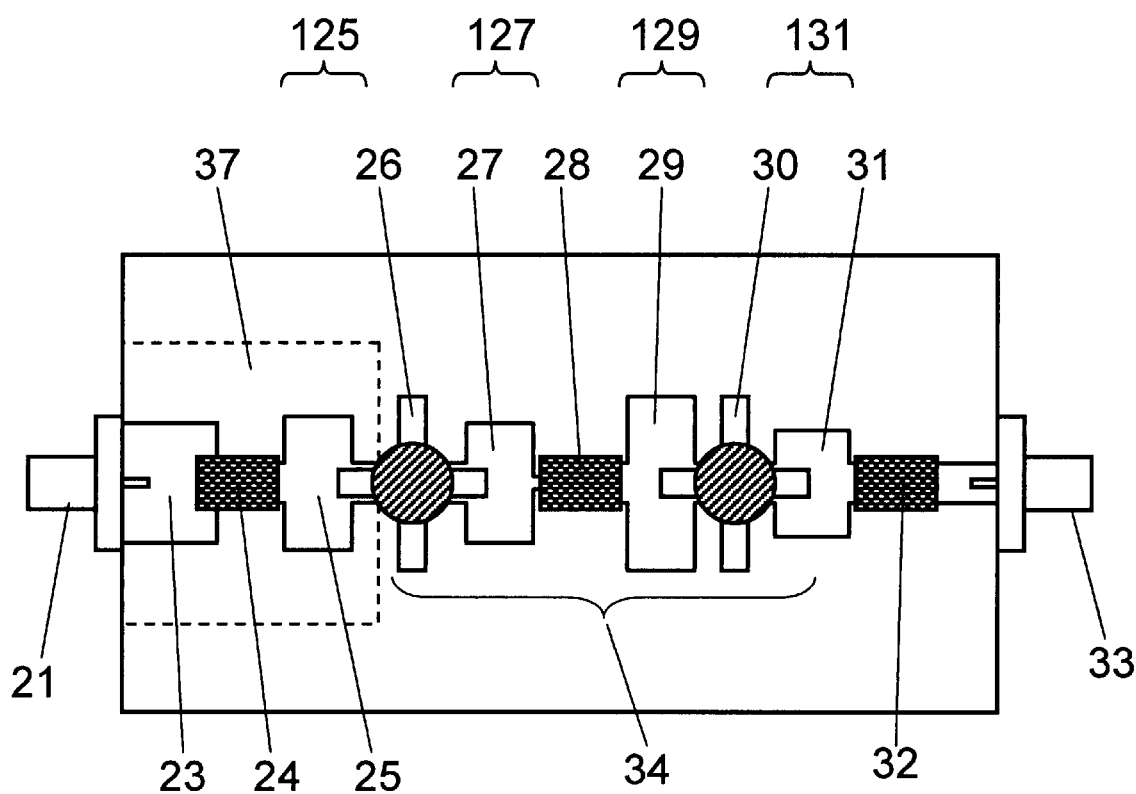
FIG. 2A is a plan view of a microwave device in accordance with a second exemplary embodiment of the present invention.
Figure 2B:
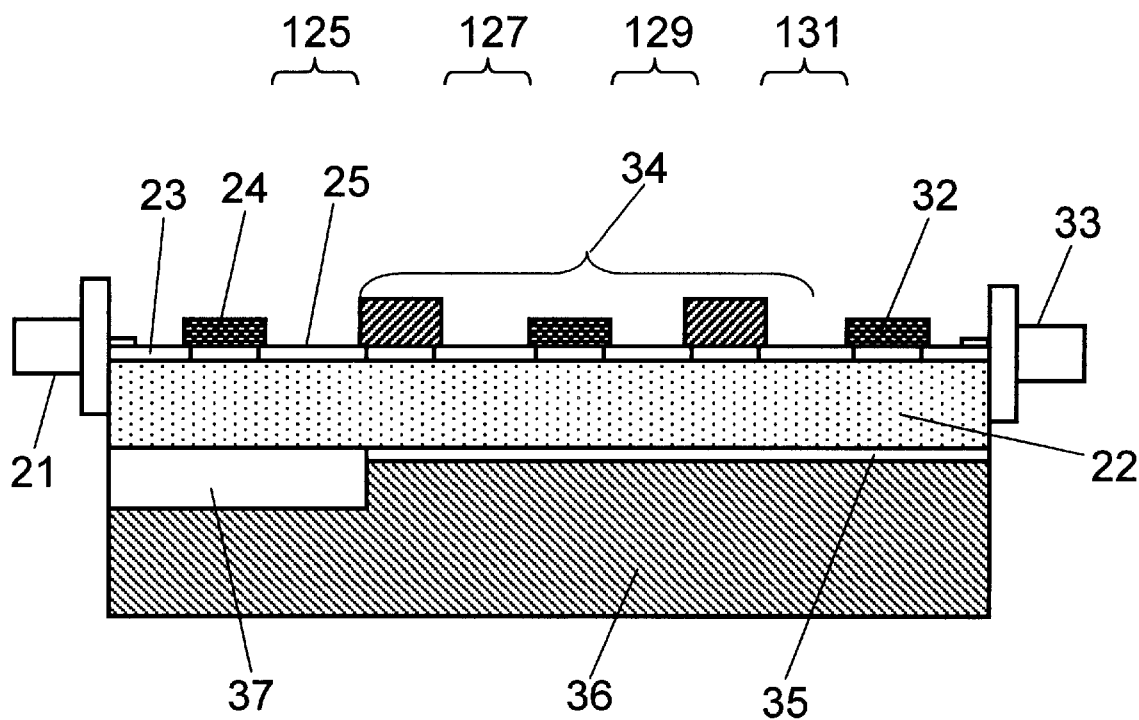
FIG. 2B is a cross-sectional view of the microwave device in accordance with the second exemplary embodiment of. the present invention.

FIGS. 2A and 2B are a plan view and a cross-sectional view of a microwave device in accordance with a second embodiment of the present invention respectively. Input terminal 21 for the 12 GHz frequency band is connected to one end of strip conductor 23 composed on PCB 22. Another end of conductor 23 is connected to conductive foil pattern 25 of an impedance matching circuit 25 through coupling capacitor 24. Furthermore, an output port of matching circuit 25 is connected to a gate of GaAs field effect transistor (FET) 26 which is a first stage transistor of low noise amplifier 34. A drain of FET 26 is connected to another impedance matching circuit 127 including conductive foil pattern 27. An output port of matching circuit 127 is connected to another impedance matching circuit 129 including conductive foil pattern 29 through coupling capacitor 28. An output port of impedance matching circuit 29 is connected to a gate of a second stage GaAs FET 30, and a drain of FET 30 is connected to a fourth impedance matching circuit 131. An output port of matching circuit 131 including conductive foil pattern 31 is connected to output terminal 33 through coupling capacitor 32, and a 12 GHz frequency band microwave is output from terminal 33 to the outside.

In FIG. 2B, strip conductor 23, conductive foil pattern 25 of the impedance matching circuit 125, and others are disposed on the front of PCB 22 made of glass-epoxy. Conductive foil 35 for grounding is disposed on the back of PCB 22. In order for PCB to be held mechanically and to be connected for grounding electrically, ground plate 36 having a thickness of about 1.5 mm made of aluminum is located in contact with the back of PCB 22.

Air layer 37 having a depth of about 0.3 mm is located on a part of ground plate 36 facing to strip conductor 23 and pattern 25 of matching circuit 125. On the back of PCB 22, a part of conductive foil 35 for grounding facing to air layer 37 is not disposed on the part of PCB 22, where PCB 22 is in contact with air layer 37 directly. When the substrate is 0.5 mm thick, an effective relative dielectric constant for a combined dielectric layer comprising the PCB and the air layer is about 2 at 12 GHz band. As in the case of the first embodiment, strip conductor 23 and matching circuit 125 embody microwave circuits with low loss in the microwave frequency band. Furthermore, using general-purpose-use glass-epoxy substrate for the PCB makes the microwave device in the second embodiment inexpensive.

It is noted that the impedance matching sometimes refers to matching to be achieved for impedance condition to optimize a circuit (e.g. noise matching), and does not always refer to usual impedance matching.

Third Embodiment

Figure 3A:
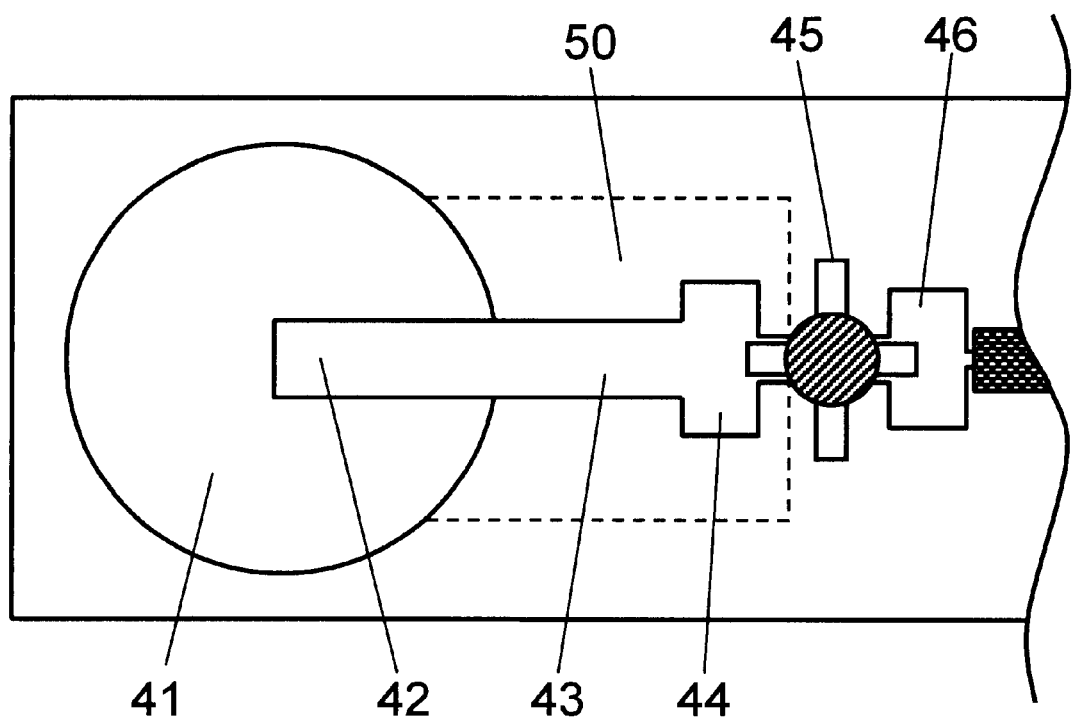
FIG. 3A is a plan view of a main part of a microwave device in accordance with a third exemplary embodiment of the present invention.
Figure 3B:
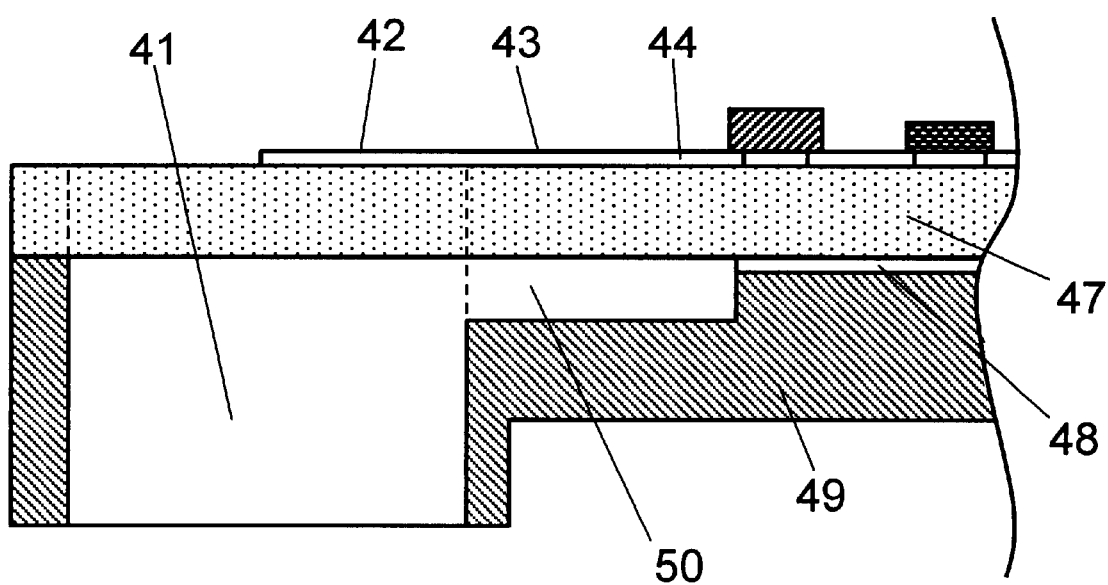
FIG. 3B is a cross-sectional view of the main part of the microwave device in accordance with the third exemplary embodiment of the present invention.

FIGS. 3A and 3B are a plan view and a cross-sectional view of a main part of a microwave device in accordance with a third embodiment of the present invention respectively. Waveguide probe 42 with an end opened is inserted into waveguide 41 in which a 12 GHz band microwave signal propagates. As in the case of the second embodiment, probe 42 is connected to matching circuit 44 through strip conductor 43. The circuits, which locate on the right side of FET 45 to which an output port of matching circuit 44 is connected, are the same circuits as of the second embodiment. The microwave signal, which is input into waveguide 41, is finally guided to an output terminal (not showed in FIGS. 3A and 3B), and is output to the outside.

In FIG. 3B, conductive foil 48 for grounding is disposed on the back of PCB 47 made of glass-epoxy. Ground plate 49 made of aluminum is located in contact with the back of PCB 47. In this embodiment, waveguide 41 and ground plate 49 are composed into one piece.

Main dimensions in each portion of this embodiment are the same as of the second embodiment, i.e. PCB 47 is about 0.5 mm thick, plate 49 about 1.5 mm thick. Air layer 50 having depth of about 0.3 mm made by a press is located on a part of ground plate 49 facing to both a portion of strip conductor 43 and a portion of matching circuit pattern 44. In this case, as well as the second embodiment, a effective relative dielectric constant for a combined dielectric layer comprising the PCB and the air layer is about 2 at 12 GHz band, and a width of strip conductor 43 is about 2.6 mm.

In this embodiment, as in the case of the second embodiment, air layer 50 being located allows the effective relative dielectric constant and dielectric loss for the combined dielectric layer to be reduced. As a result, the loss in the microwave device is reduced. Air layer 50 is processed by general purpose press working, therefore cost of the microwave device is reduced. Furthermore, changing a stamping-die allows the depth of air layer 50 to set arbitrarily, and allows the effective relative dielectric constant to be attained to desired value up to the value of the relative dielectric constant of glass-epoxy.

In addition to the process by a press, this embodiment allows ground plate 49 to be made by a die-casting and attains the same effect as using ground plate made by a press. As shown in FIG. 3B, waveguide probe 42 and a part of microstrip line share a part of PCB. Waveguide probe 42 and strip conductor 43 are composed into one piece. But the same effect as mentioned above is attained without probe 42 and conductor 43 composed into one piece.

Fourth Embodiment

Figure 4A:
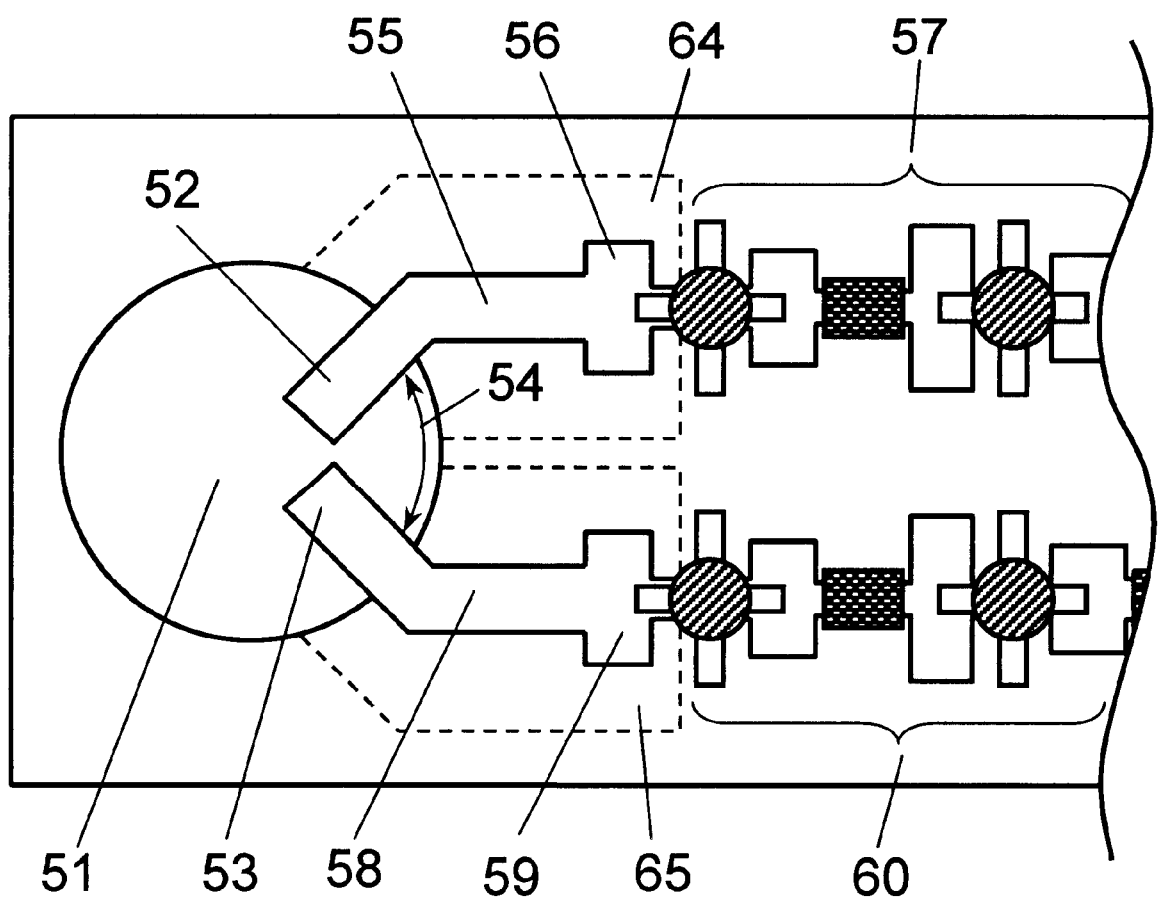
FIG. 4A is a plan view of a main part of a microwave device in accordance with a fourth exemplary embodiment of the present invention.
Figure 4B:
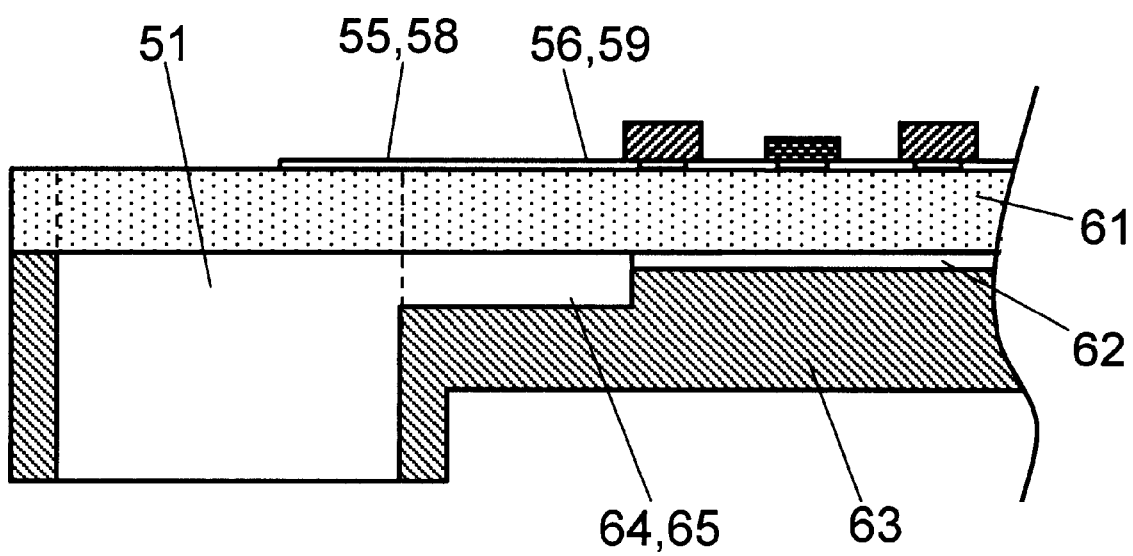
FIG. 4B is a cross-sectional view of the main part of the microwave device in accordance with the third exemplary embodiment of the present invention.
Figure 5:
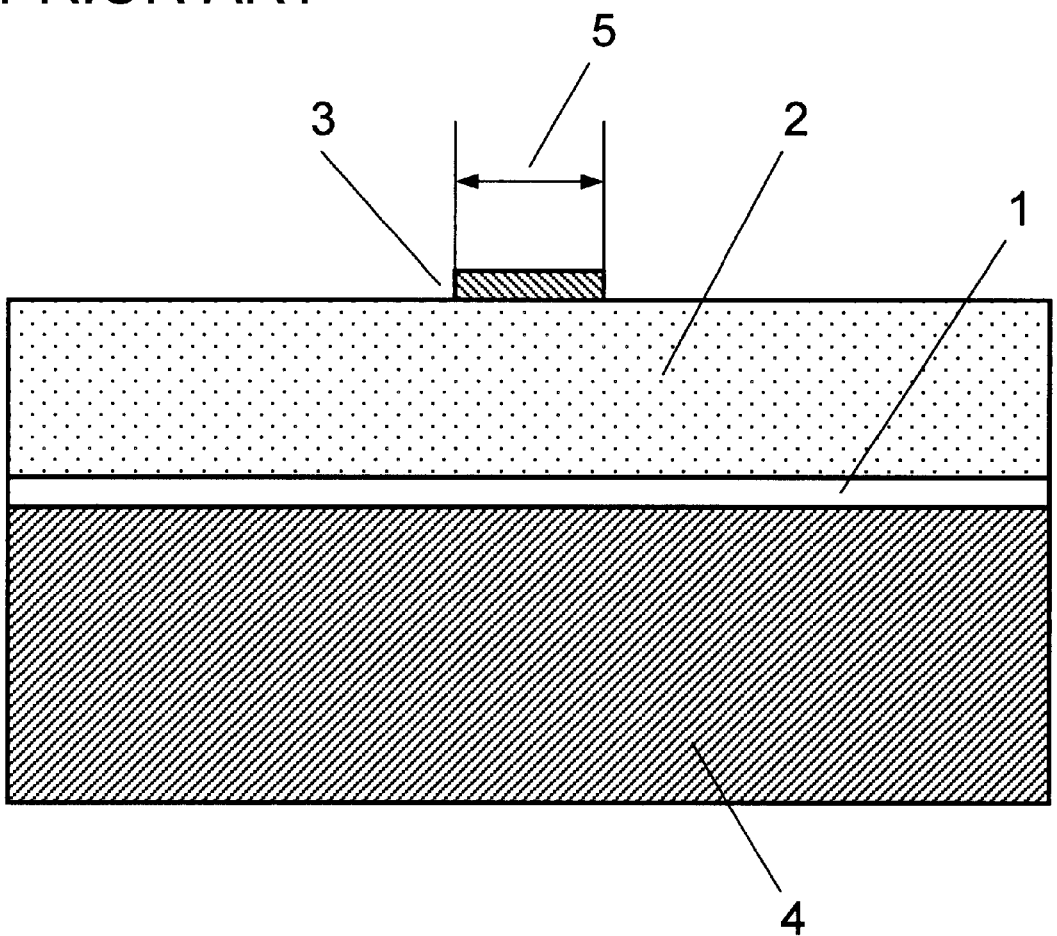
FIG. 5 is a cross-sectional view of a conventional microstrip line.

FIGS. 4A and 4B are a plan view and a cross-sectional view, respectively, of a main part of a microwave device in accordance with a fourth embodiment of the present invention. In this embodiment, waveguide probe 52 with an end opened and waveguide probe 53 with an end opened are inserted into circular waveguide 51, for angle 54 formed by a couple of probes to be about 90°. The couple of probes are connected to strip conductors 55 and 58 respectively. As in the case of the third embodiment, the two strip conductors are connected to matching circuits 56 and 59 respectively. The two matching circuits are connected to low noise amplifiers 57 and 60 respectively. Each amplifier is finally connected to each output terminal (not shown in FIGS. 4A and 4B) of the device, and a microwave is output from each terminal to the outside.

In FIG. 4B as in the case of the third embodiment, conductive foil 62 for grounding is disposed on the back of PCB 61 made of glass-epoxy. Ground plate 63 is located in contact with the back of PCB 61.

In this embodiment, air layers 64 and 65 are located on parts of ground plate 63 facing to strip conductor 55 and pattern 56 of matching circuit, and facing to strip conductor 58 and pattern 59 of matching circuit respectively, as well. As in the case of the third embodiment, this embodiment allows loss in the microstrip lines and the matching circuit to be reduced. Consequently the loss in the microwave device is reduced. As in the case of the third embodiment, cost of the microwave device is reduced.

In this embodiment, since waveguide probes 52 and 53 are located to form an angle of about 90 degree, the microwave device can simultaneously and efficiently receive two linearly-polarized microwave signals, which are orthogonal to each other. In this embodiment, waveguide probes 52 and 53 share the strip conductors 55 and 58 respectively as shown in FIG. 4B. Strip conductors 55 and 58 are composed into one piece. But the same effect as mentioned above is attained without strip conductors 55 and 58 composed into one piece.

A microstrip line, which the present invention provides, comprises a PCB made of a dielectric substrate, a strip conductor which is composed on a front surface of the PCB to propagate a microwave signal, and an air layer located between the PCB and a ground plate. As a result, the microstrip line attains a desired characteristics for a microwave transmission line. The air layer allows effective dielectric constant and effective dielectric loss of the microstrip line to be reduced. Consequently, as shown in the embodiment mentioned above, the present invention allows using low cost dielectric substrate with relatively high dielectric loss to provide a low loss and low cost microstrip line and a microwave device using the microstrip line.

What is claimed is:
1. A microstrip line comprising:
   a dielectric substrate which has a relative dielectric constant of 1 or more;
   a strip conductor which is disposed above said dielectric substrate, wherein a microwave signal propagates along said strip conductor;
   a metal plate for grounding which is disposed below dielectric substrate and which has a groove facing toward said strip conductor; and
   a conductive foil for grounding which is disposed between said metal plate and said dielectric substrate.
2. The microstrip line as defined in claim 1, wherein said conductive foil has an opening which coincides with said groove.
3. The microstrip line as defined in claim 1, wherein said metal plate is aluminum.
4. The microstrip line as defined in claim 1, wherein said dielectric substrate has a relative dielectric constant of about 4.
5. The microstrip line as defined in claim 1, wherein a part which is formed by combining said dielectric substrate and the groove has an effective relative dielectric constant of about 2.
6. The microstrip line as defined in claim 1, wherein said dielectric substrate is a glass-epoxy substrate.
7. The microstrip line as defined in claim 1, wherein a width of the groove is about three times a width of said strip conductor.
8. The microstrip line as defined in claim 1, wherein said groove has a depth of about 0.3 mm.
9. The microstrip line as defined in claim 1, wherein said conductive foil is in contact with said metal plate.
10. A microwave device comprising:
   (a) an input terminal into which a microwave signal is input;
   (b) a microstrip line which is coupled to said input terminal, said microstrip line comprising:
      (b-1) a dielectric substrate which has a relative dielectric constant of 1 or more;
      (b-2) a strip conductor which is disposed above said dielectric substrate, wherein a microwave signal propagates along said strip conductor;
      (b-3) a metal plate for grounding which is disposed below said dielectric substrate and which has a groove whose position is facing toward said strip conductor; and
      (b-4) a conductive foil for grounding which is disposed between said metal plate and said dielectric substrate;
   (c) an impedance matching circuit which is coupled to an output port of said microstrip line;
   (d) a low noise amplifier which is coupled to an output port of said impedance matching circuit; and
   (e) an output terminal which is coupled to an output port of said low noise amplifier.
11. The microwave device as defined in claim 10, wherein said impedance matching circuit comprises:
   a dielectric substrate which has a relative dielectric constant of 1 or more;
   a strip conductor which is disposed on a face of said dielectric substrate, wherein a microwave signal propagates along the strip conductor; and a metal plate for grounding which is disposed in contact with a back of said dielectric substrate and which has a groove whose position is facing toward said strip conductor.

12. The microwave device as defined in claim 10, wherein said conductive foil is in contact with said metal plate.

13. A microwave device comprising:
  (a) a waveguide into which a microwave signal is input;
  (b) a waveguide probe which takes a microwave signal out of said waveguide;
  (c) a microstrip line which is coupled to said waveguide probe, said microstrip line comprising:
    (c-1) a dielectric substrate which has a relative dielectric constant of 1 or more;
    (c-2) a strip conductor which is disposed on a face of said dielectric substrate, wherein a microwave signal propagates along said strip conductor;
    (c-3) a metal plate for grounding which is disposed in contact with a back of said dielectric substrate and which has groove whose position is facing to said strip conductor; and
    (c-4) a conductive foil for grounding which is disposed between said metal plate and said dielectric substrate;
  (d) an impedance matching circuit which is coupled to an output port of said microstrip line;
  (e) a low noise amplifier whose input port is coupled to an output port of said impedance matching circuit; and
  (f) an output terminal which is coupled to an output port of said low noise amplifier.

14. The microwave device as defined in claim 13, wherein said impedance matching circuit comprises:

a dielectric substrate which has a relative dielectric constant of 1 or more;

a strip conductor which is disposed on a face of said dielectric substrate, wherein a microwave signal propagates along the strip conductor; and a metal plate for grounding which is disposed in contact with a back of said dielectric substrate and which has a groove whose position is facing toward said strip conductor.

15. The microstrip line as defined in claim 13, wherein said waveguide is a circular waveguide, and wherein said waveguide probe and a further waveguide probe are located nearly orthogonal to each other.

16. The microwave device as defined in claim 13, wherein said conductive foil is in contact with said metal plate.

\* \* \* \* \*